United States Patent

Shih et al.

[11] Patent Number: 5,804,488
[45] Date of Patent: Sep. 8, 1998

[54] METHOD OF FORMING A TUNGSTEN SILICIDE CAPACITOR HAVING A HIGH BREAKDOWN VOLTAGE

[75] Inventors: Chun-Yi Shih, Hsinchu; Shun-Liang Hsu; Jyh-Kang Ting, both of Hsin-Chu, all of Taiwan

[73] Assignee: Taiwan Semiconductor Manufacturing Company, Ltd., Hsin-Chu, Taiwan

[21] Appl. No.: 518,702

[22] Filed: Aug. 24, 1995

[51] Int. Cl.⁶ .................... H01L 21/20; H01L 21/8242
[52] U.S. Cl. .................... 438/396; 438/253; 438/655
[58] Field of Search ............... 437/47, 52, 60, 437/200, 919; 148/DIG. 147; 438/253, 396, 239, 250, 393, 655, 664

[56] References Cited

U.S. PATENT DOCUMENTS

| | | | |
|---|---|---|---|
| 5,037,772 | 8/1991 | McDonald | 437/52 |
| 5,130,267 | 7/1992 | Kaya et al. | 437/47 |
| 5,173,437 | 12/1992 | Chi | 437/60 |
| 5,338,701 | 8/1994 | Hsu et al. | 437/60 |
| 5,356,826 | 10/1994 | Natsume | 437/60 |
| 5,364,803 | 11/1994 | Lur et al. | 437/40 |
| 5,393,691 | 2/1995 | Hsu et al. | 437/60 |
| 5,470,775 | 11/1995 | Nariani | 437/52 |
| 5,554,558 | 9/1996 | Hsu et al. | 437/60 |
| 5,686,329 | 11/1997 | Chang et al. | 438/253 |
| 5,698,463 | 12/1997 | Suga | 438/253 |

FOREIGN PATENT DOCUMENTS 0183623  11/1985  European Pat. Off. .

OTHER PUBLICATIONS

Wolf et al., Silicon Processing for the VLSI Era–vol. 1, pp. 184–185, & 395, 1986 (no month).

*Primary Examiner*—Charles L. Bowers, Jr.
*Assistant Examiner*—Toniae M. Thomas
*Attorney, Agent, or Firm*—George O. Saile; Stephen B. Ackerman

[57] ABSTRACT

A method for making a polycide-to-polysilicon capacitor having an improved breakdown voltage is described. A first layer of doped polysilicon is formed over a silicon substrate. A silicide layer is formed over the first layer of doped polysilicon. An oxide layer is formed over the silicide layer, and the silicide layer is then annealed. A second layer of doped polysilicon is formed over the oxide layer. The second layer of doped polysilicon is patterned to form a top plate of the capacitor. The oxide layer is removed except under the top plate of the capacitor, where it acts as a capacitor dielectric. The first layer of doped polysilicon and the silicide layer are patterned to form a polycide bottom plate of the capacitor.

18 Claims, 5 Drawing Sheets

METHOD OF FORMING A TUNGSTEN SILICIDE CAPACITOR HAVING A HIGH BREAKDOWN VOLTAGE

RELATED PATENT APPLICATION

1) "Method of Making High Precision W-Polycide-to-Poly Capacitors in Digital/Analog Process", inventors S. L. Hsu, C. Y. Shi. J. K. Ting, Ser. No. 08/387,081, filing date Feb. 13, 1995.

BACKGROUND OF THE INVENTION

(1) Field of the Invention

The invention relates to the manufacture of highly dense integrated circuits and more particularly to the formation of polycide-to-polysilicon capacitors having improved voltage breakdown.

(2) Description of the Related Art

In recent years there continues to be dramatic density increases in integrated circuit technology. The minimum feature size of lithography has been reduced to below one micrometer. In the fabrication of precision capacitors at these reduced dimensions, it is increasingly difficult to maintain such parameters as high breakdown voltage.

Workers in the field have described the formation of capacitors using two layers of polysilicon. McDonald in U.S. Pat. No. 5,037,772 describes a method for fabricating a polysilicon-to-polysilicon capacitor on the same chip as CMOS and BiCMOS devices. A first polysilicon layer is deposited and ion-implanted with arsenic. A silicon oxide/silicon nitride dielectric layer is then formed and patterned to the capacitor dimensions. A second polysilicon layer is deposited. An anisotropic etch is then performed, with the dielectric layer acting as a mask to protect the first polysilicon layer.

In European Patent Application 0 183 623, Krishner also describes a process for producing a precision polysilicon-to-polysilicon capacitor in conjunction with MOS devices on the same chip. However, it is noted that the deposition of silicon nitride as part of the dielectric layer causes uniformity problems, due to the difficulty of depositing a uniformly thick layer of the silicon nitride. Thus a single layer of thermally grown silicon oxide is used as the capacitor dielectric. The oxidation process includes an annealing step. The dielectric layer is grown from a first polysilicon layer that has been ion-implanted with phosphorus or arsenic. A low energy implant is described which allows for precise control of the subsequent dielectric thickness. However, neither this approach nor that in U.S. Pat. No. 5,037,772 directly addresses the problem of low breakdown voltage.

In addition, the use of polycide gates and capacitors, polycide being a combination of layers of polysilicon and a refractory metal silicide, is becoming very important as the industry moves to smaller device geometries. As these geometries become smaller, polysilicon becomes less satisfactory due to its high resistivity and the subsequent affect on RC time delays and IR voltage drops. The use of a combination of a top-layer refractory metal silicide with polysilicon, to form a polycide, has proven suitable because of its lower resistivity.

A method of forming a polycide-to-polysilicon capacitor and CMOS integrated circuit is described in U.S. Pat. No. 5,393,691 (Hsu, et al.), to the same assignee as the invention. After deposition a first layer of doped polysilicon followed by deposition of a silicide, to provide the polycide bottom capacitor plate of the invention, the silicide is annealed to reduce resistance. However, due to the resulting rough surface, the polycide-to-polysilicon capacitor has a low breakdown voltage.

SUMMARY OF THE INVENTION

It is therefore a principal object of the invention to provide a method for making a polycide-to-polysilicon capacitor which has an improved breakdown voltage.

These objects are achieved by forming a first layer of doped polysilicon over a silicon substrate. A silicide layer is formed over the first layer of doped polysilicon. An oxide layer is formed over the silicide layer, and the silicide layer is then annealed. A second layer of doped polysilicon is formed over the oxide layer. The second layer of doped polysilicon is patterned to form a top plate of the capacitor. The oxide layer is removed except under the top plate of the capacitor, where it acts as a capacitor dielectric. The first layer of doped polysilicon and the silicide layer are patterned to form a polycide bottom plate of the capacitor.

DESCRIPTION OF THE PREFERRED EMBODIMENTS

Referring now to FIGS. 1, 2 and 3A–3D, a first method of the invention for forming a polycide-to-polysilicon capacitor is described in conjunction with formation of an FET (Field Effect Transistor). It will be recognized by those familiar with the art that analog capacitors may be formed together with other integrated circuit structures and are not limited to use with FET's.

Figure 1:
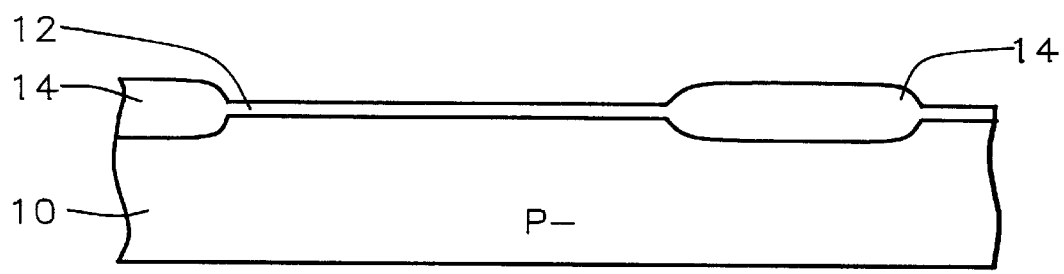
FIGS. 1, 2 and 3A–3D are a cross-sectional representation of a first method of the invention for fabricating a polycide-to-polysilicon capacitor.

Referring now to FIG. 1, there is shown a lightly doped p-type substrate 10, preferably composed of silicon having a (100) crystallographic orientation. Field oxide regions 14 having a thickness of between about 4000 and 6000 Angstroms are formed by well-known processes in the art, such as by LOCOS (LOCal Oxidation of Silicon). The field oxide regions are used to isolate semiconductor regions from other such regions, and to isolate the capacitor of the invention from the semiconductor regions. The surface of the silicon substrate 10 is thermally oxidized to form a gate oxide 12 to a thickness of between about 100 and 200 Angstroms.

Figure 2:
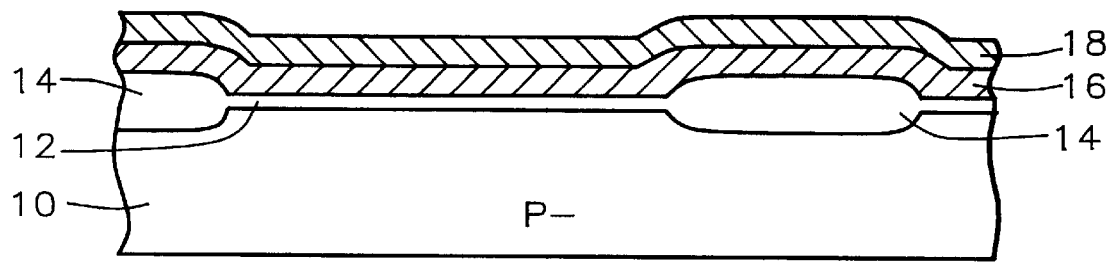

With reference to FIG. 2, a first layer of polysilicon 16 is blanket deposited over gate oxide 12 and field oxide regions 14, by LPCVD (Low Pressure Chemical Vapor Deposition), to a thickness of between about 1000 and 2000 Angstroms. The polysilicon layer 16 is doped by diffusion with phosphorus using phosphorus oxychloride ($POCl_3$) as a source at a temperature of between about 800° and 920° C., or alternately is ion implanted, to provide the proper conductivity.

Silicide layer 18 is then blanket deposited over the polysilicon 16 by LPCVD. This layer is formed preferably of tungsten silicide ($WSi_x$), by reacting tungsten fluoride ($WF_6$) with silane ($SiH_4$), and is formed to a thickness of between about 1000 and 2000 Angstroms.

When tungsten silicide is used, the amorphous refractory metal silicide layer has a chemical formulation of $WSi_x$, where x is between about 2.3 and 2.8. An x value above this range would result in an undesirably high resistivity for the silicide film. An x value below this range increases the stress of the $WSi_x$ film and leads to adhesion problems between the silicide and polysilicon.

Conventional methods produce rough metal silicide surfaces because annealing is performed before the subsequent deposit of the interpolysilicon oxide (IPO). The metal silicide as deposited has a smooth surface, but the surface becomes rough, or uneven, after an immediate annealing step. This results in a low electric-field breakdown voltage EBD.

Figure 5:
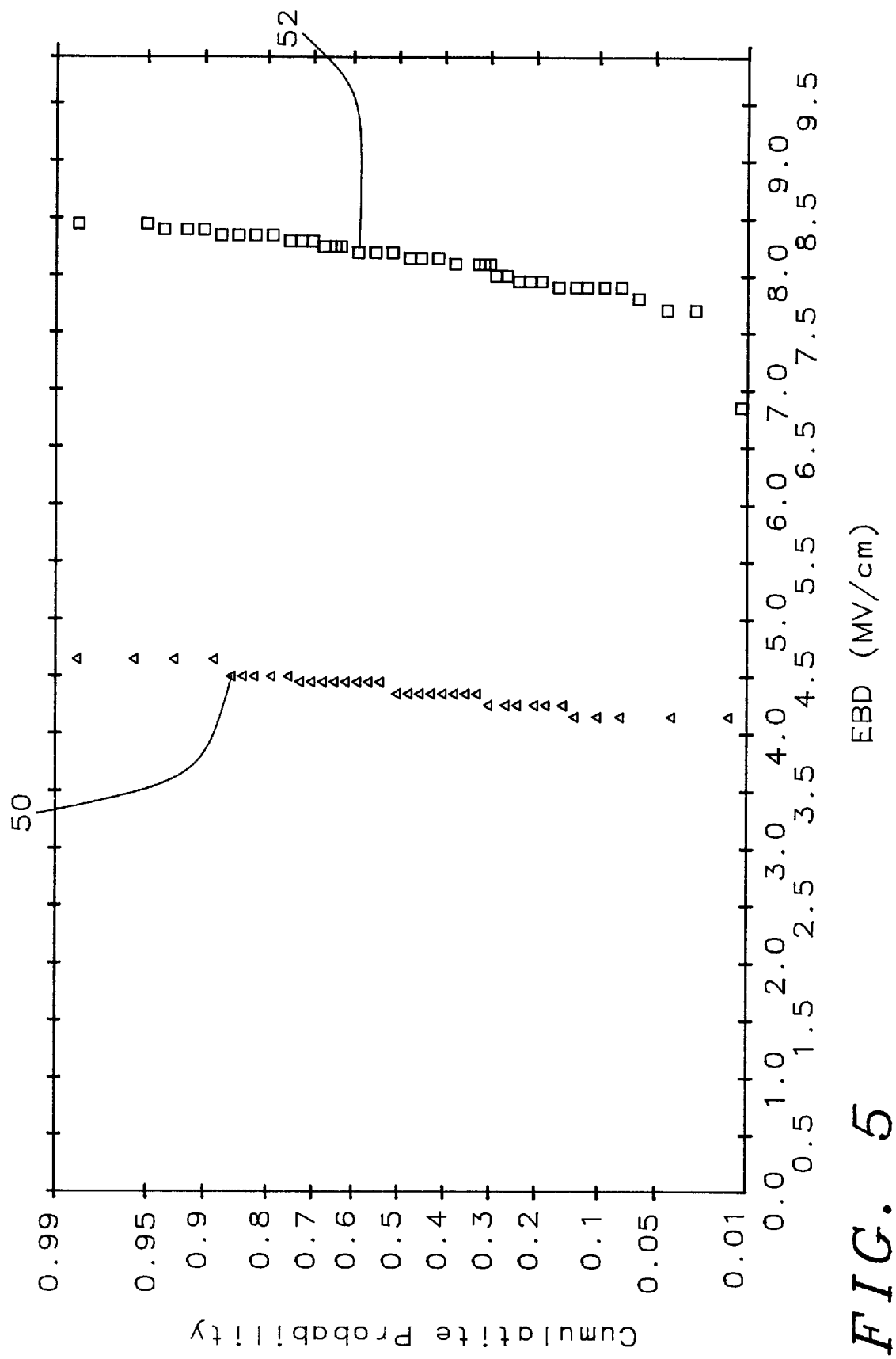
FIG. 5 is a graphical representation of electric-field breakdown voltage of a polycide-to-polysilicon capacitor of the prior art, and of the capacitor of the invention.

In an important aspect of the invention, the IPO is deposited over the silicide (either before or after patterning of the gate and bottom capacitor plate) and the high temperature $WSi_x$ anneal is performed after deposition of the IPO. With the oxide layer in place during annealing, the $WSi_x$ surface remains smooth, resulting in a higher EBD for the capacitor of the invention. This is indicated by the graphical results of FIG. 5, in which data point series 50 indicates breakdown voltage for the prior art method of between about 4.0 and 5.0 MV/cm (megavolt per centimeter). The capacitor of the invention has much improved voltage breakdown results, as depicted by series 52, with a range of between about 7.5 and 8.5 MV/cm.

Figure 3A:
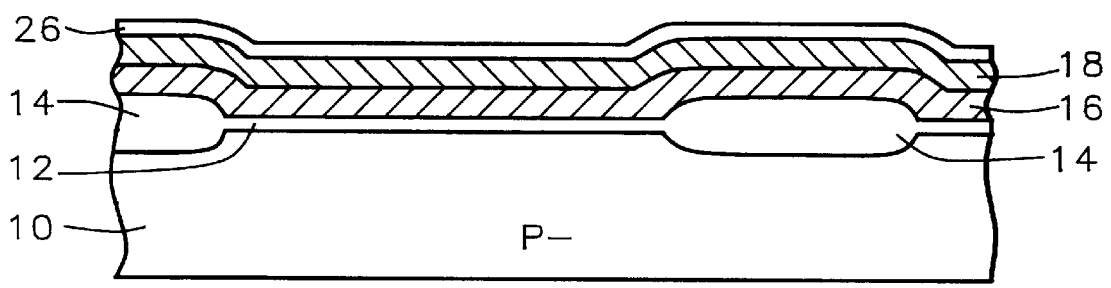

Referring now to FIGS. 3A–3D, the first method of the invention, in which the gate and bottom capacitor plate are patterned after the anneal, is further detailed. As shown in FIG. 3A, the oxide layer 26 is formed by different deposition methods, depending on the circuit density. For example, for 0.8 or 1.0 micron technology, the oxide layer 26 is deposited using LPCVD by decomposing TEOS (tetraethoxysilane) at a temperature of between about 650° and 750° C., to form an oxide having a thickness of between about 600 and 1200 Angstroms. For 0.6 micron dimensions, an HTO (High Temperature Oxide) process is used utilizing $N_2O$ (nitrous oxide) and $SiH_2Cl_2$ at a temperature of between about 750° and 850° C., to form oxide 26 to a thickness of between about 300 and 500 Angstroms.

The silicide layer 18 is then annealed at a temperature of between about 800° and 1000° C. for between about 30 and 90 minutes, in an atmosphere of between about 5 and 10% $O_2$ (oxygen), to cause the amorphous refractory metal silicide to change into its crystalline phase.

Figure 3B:
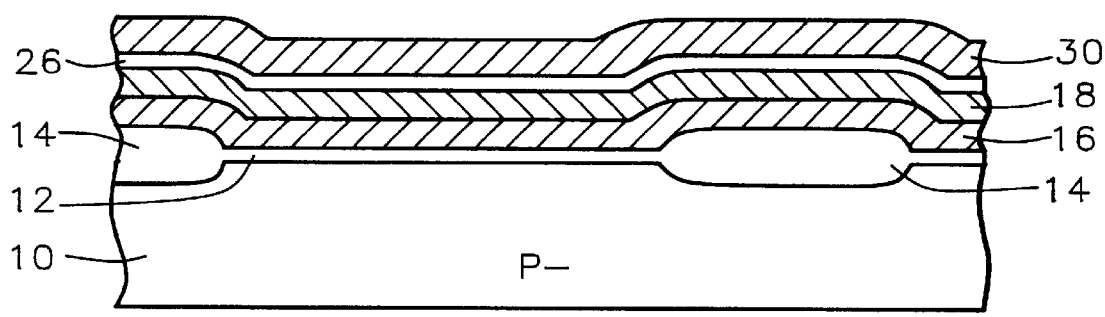

Referring now to FIG. 3B, a second polysilicon layer 30 is deposited by LPCVD to a thickness of between about 2500 and 4000 Angstroms, and is doped in the same manner as first poly 16.

Figure 3C:
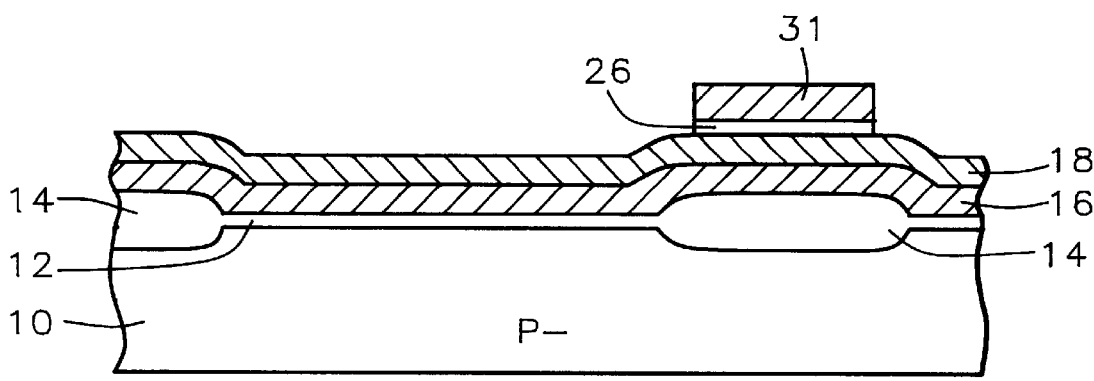
Figure 3D:
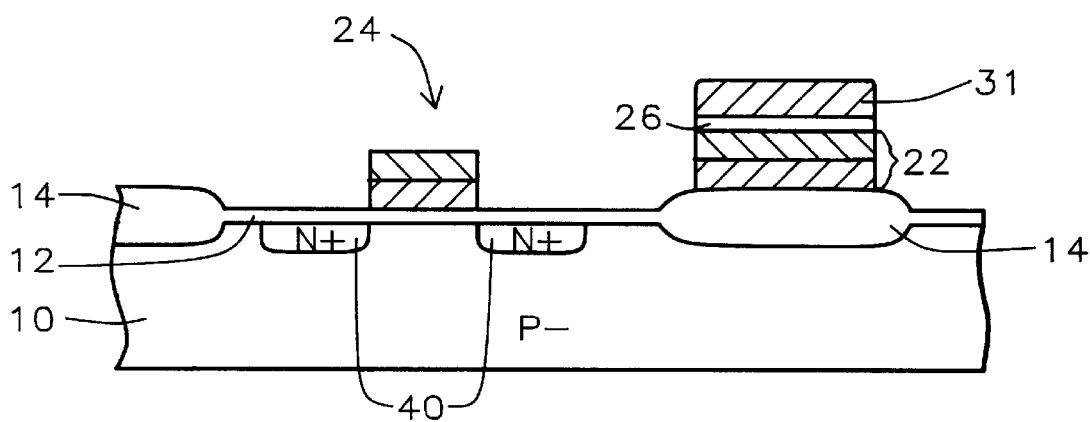

Polysilicon layer 30 is patterned by conventional lithography and etching to form the capacitor top plate 31. The oxide 26 is then removed by an etch of 50:1 BOE (buffered oxide etch) or 50:1 HF (hydrofluoric acid) for between about 3 and 5 minutes, in all but the area under the top capacitor plate. The resultant structure is shown in FIG. 3C.

As shown in FIG. AD, the polycide (polysilicon 16 and silicide 18) is now patterned, by reactive ion etching with $SF_6$ (sulfur hexafluoride) and HBr (hydrogen bromide), to form the polycide capacitor bottom plate 22, thus completing the polycide-to-polysilicon capacitor of the invention. Also patterned at the same time as the capacitor bottom plate 22 is a polycide gate 24 for an FET (Field Effect Transistor) device, to be formed.

The FET device is completed by forming source and drain regions 40 in the substrate, adjacent to polycide gate 24, by methods well known in the art. Subsequent processing takes place, including, for example, metallization and passivation, that are not important to the invention and thus are not described in detail. It will be understood by those skilled in the art that the invention is not limited to formation of a single N channel FET, since a P channel FET could be formed by doping the substrate with an N-type dopant and implanting P-type impurities for the source and drain. A CMOS (Complementary Metal Oxide Semiconductor) device could also be formed.

Figure 4A:
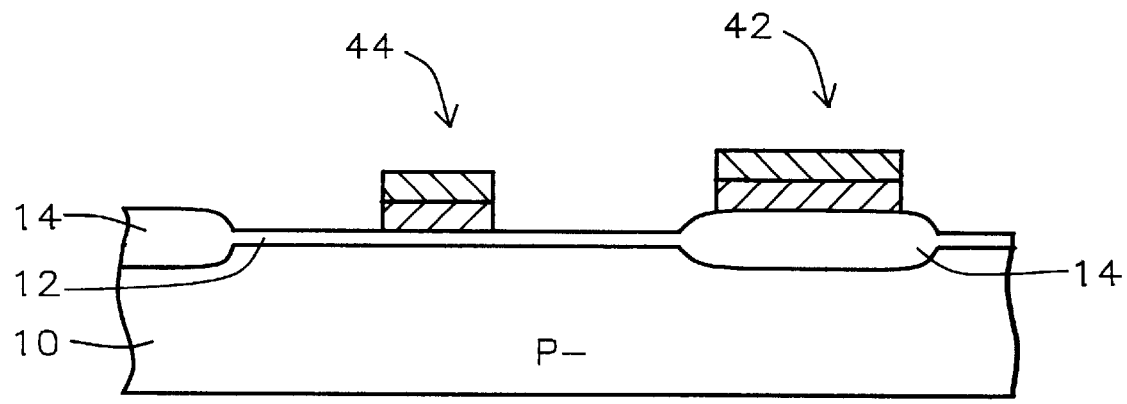
FIG. 4A–4D are a graphical representation of a second method of the invention for fabricating a polycide-to-polysilicon capacitor.
Figure 4B:
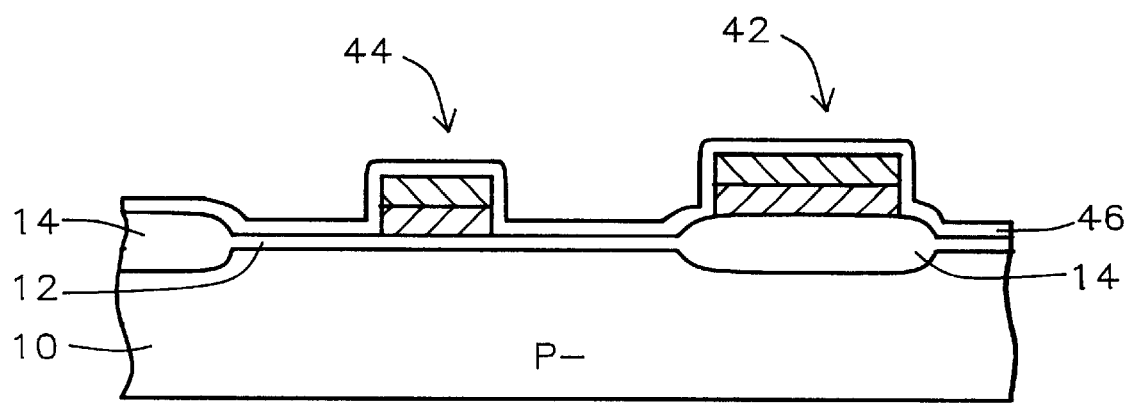

Referring now to FIGS. 4A–4D, a second method of the invention is shown, in which the gate and bottom capacitor plate are patterned before the silicide anneal. Starting from the FIG. 2 structure, the polycide capacitor bottom plate 42 and FET gate 44 are patterned in the same way as described earlier, as depicted in FIG. 4A. A CVD oxide 46 is deposited, as shown in FIG. 4B, also in the manner and thickness described earlier, to serve as the interpoly oxide. The important silicide anneal is performed immediately after oxide deposition, as in the first method of the invention, in the same manner as earlier described.

Figure 4C:
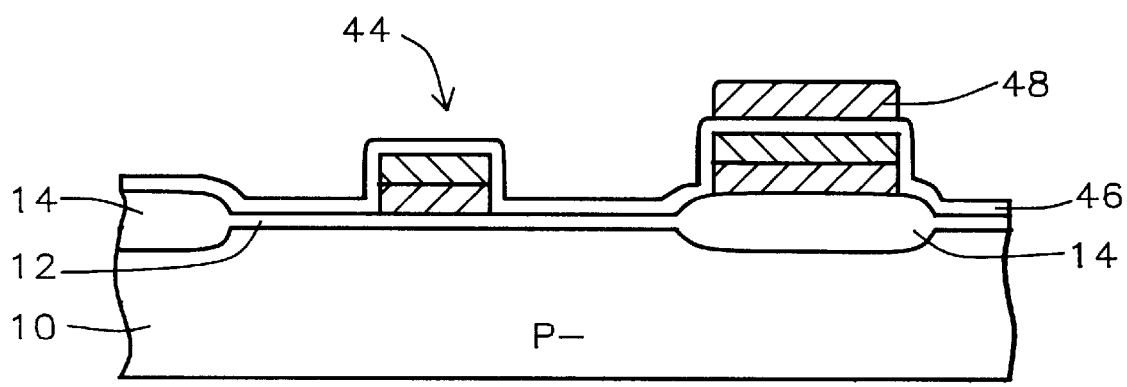
Figure 4D:
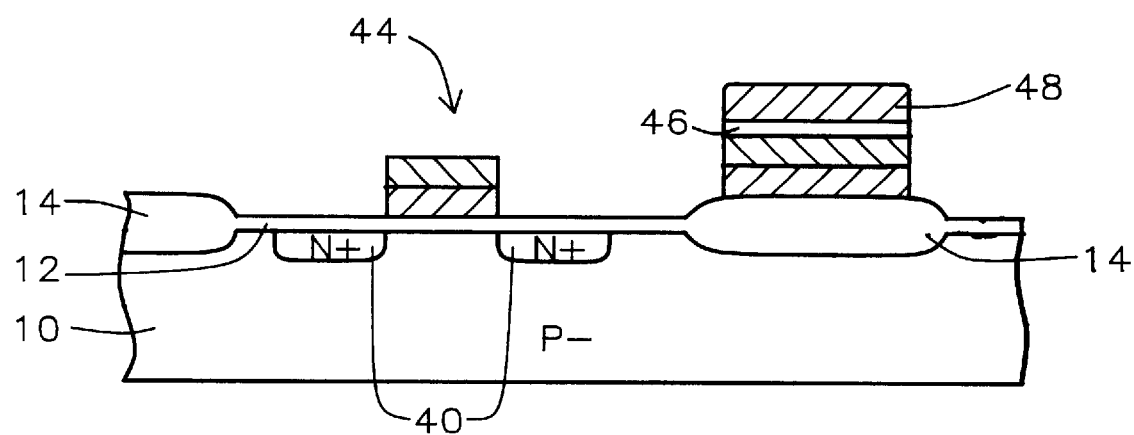

With reference to FIG. 4C, a second poly layer is deposited and patterned to form capacitor top plate 48. The oxide 46 is removed from all but the interpoly region of the capacitor, completing formation of the capacitor. The FET is completed as earlier detailed to result in the FIG. 4D structure.

While the invention has been particularly shown and described with reference to the preferred embodiments, it will be understood by those skilled in the art that various changes in form and details may be made without departing from the spirit and scope of the invention.

What is claimed is:

1. A method for forming a capacitor with high breakdown voltage, on a silicon substrate, comprising the steps of:

forming a first layer of doped polysilicon over said silicon substrate;

forming a silicide layer over said first layer of doped polysilicon;

forming an oxide layer over said silicide layer, then annealing said silicide layer, immediately after said forming an oxide layer, whereby said high breakdown voltage results;

forming a second layer of doped polysilicon over said oxide layer;

patterning said second layer of polysilicon to form a top plate of said capacitor;

removing said oxide layer except under said top plate of said capacitor, where it acts as a capacitor dielectric; and patterning said first layer of doped polysilicon and said silicide layer to form a polycide bottom plate of said capacitor.

2. The method of claim 1 wherein said silicide layer is annealed at a temperature of between about 800° and 1000° C.

3. The method of claim 2 wherein said annealing is performed in an atmosphere of between about 5 and 10% $O_2$ (oxygen).

4. The method of claim 1 wherein said silicide layer is formed of $WSi_x$ (tungsten silicide), wherein x is between about 2.3 and 2.8.

5. The method of claim 4 wherein said $WSi_x$ is formed to a thickness of between about 1000 and 2000 Angstroms, by depositing $WF_6$ (tungsten fluoride) and $SiH_4$ (silane) using LPCVD (Low Pressure Chemical Vapor Deposition).

6. The method of claim 1 wherein, for 0.8 to 1.0 micron technology, said oxide layer is deposited using LPCVD by decomposing TEOS (tetraethoxysilane) at a temperature of between about 650° and 750° C., to a thickness of between about 600 and 1200 Angstroms.

7. The method of claim 1 wherein, for 0.6 micron technology, said oxide layer is deposited using a HTO (High Temperature Oxide) process utilizing $N_2O$ (nitrous oxide) and $SiH_2Cl_2$ at a temperature of between about 750° and 850° C., to a thickness of between about 300 and 500 Angstroms.

8. The method of claim 1 wherein said patterning said first layer of doped polysilicon and said silicide layer is performed after said removing said oxide layer except under said top plate.

9. The method of claim 1 wherein said patterning said first layer of doped polysilicon and said silicide layer is performed after said forming of said silicide layer.

10. A method of forming an integrated circuit, in and on a silicon substrate, which includes a capacitor with high breakdown voltage and an FET (Field Effect Transistor) device with polycide gate, comprising the steps of:

forming field oxide regions and a gate oxide layer in and over said silicon substrate;

forming a first layer of doped polysilicon over said field oxide regions and said gate oxide layer;

forming a silicide layer over said first layer of doped polysilicon;

patterning said first layer of doped polysilicon and said silicide layer to form a polycide bottom plate of said capacitor, and to form said polycide gate;

forming an oxide layer over the silicon substrate, then annealing said polycide bottom plate and said polycide gate, immediately after said forming an oxide layer, whereby said high breakdown voltage results;

forming a second layer of doped polysilicon over said oxide layer;

patterning said second layer of doped polysilicon to form a top plate of said capacitor;

removing said oxide layer except under said top plate of said capacitor, where it acts as a capacitor dielectric;

forming source and drain regions for said FET device in said substrate adjacent to said polycide gate; and completing said integrated circuit.

11. The method of claim 10 wherein said silicide layer is annealed at a temperature of between about 800° and 1000° C.

12. The method of claim 11 wherein said annealing is performed in an atmosphere of between about 5 and 10% $O_2$.

13. The method of claim 10 wherein said silicide layer is formed of $WSi_x$ (tungsten silicide), wherein x is between about 2.3 and 2.8.

14. The method of claim 13 wherein said $WSi_x$ is formed to a thickness of between about 1000 and 2000 Angstroms, by depositing $WF_6$ (tungsten fluoride) and $SiH_4$ (silane) using LPCVD (Low Pressure Chemical Vapor Deposition).

15. The method of claim 10 wherein, for 0.8 to 1.0 micron technology, said oxide layer is deposited using LPCVD by decomposing TEOS (tetraethoxysilane) at a temperature of between about 650° and 750° C., to a thickness of between about 600 and 1200 Angstroms.

16. The method of claim 10 wherein, for 0.6 micron technology, said oxide layer is deposited using a HTO (High Temperature Oxide) process utilizing $N_2O$ (nitrous oxide) and $SiH_2Cl_2$ at a temperature of between about 750° and 850° C., to a thickness of between about 300 and 500 Angstroms.

17. The method of claim 10 wherein said patterning said first layer of doped polysilicon and said silicide layer is performed after said removing said oxide layer except under said top plate.

18. The method of claim 10 wherein said patterning said first layer of doped polysilicon and said silicide layer is performed after said forming of said silicide layer.

* * * * *